United States Patent
Kitajima

[11] Patent Number: 5,827,774
[45] Date of Patent: Oct. 27, 1998

[54] ION IMPLANTATION METHOD USING TILTED ION BEAM

[75] Inventor: Hiroshi Kitajima, Tokyo, Japan

[73] Assignee: NEC Corporation, Japan

[21] Appl. No.: 867,146

[22] Filed: Jun. 2, 1997

[30] Foreign Application Priority Data

May 31, 1996 [JP] Japan .................................. 8-138363

[51] Int. Cl.$^6$ .............................................. H01L 21/425
[52] U.S. Cl. .......................................... 438/525; 438/302
[58] Field of Search ...................................... 438/302, 305, 438/306, 307, 525

[56] References Cited

U.S. PATENT DOCUMENTS

| | | | |
|---|---|---|---|
| 4,771,012 | 9/1988 | Yabu et al. | 438/302 |
| 5,155,369 | 10/1992 | Current | 438/525 |
| 5,355,006 | 10/1994 | Iguchi | 438/302 |
| 5,459,085 | 10/1995 | Pasen et al. | 438/302 |

FOREIGN PATENT DOCUMENTS

| | | |
|---|---|---|
| 63-95669 | 4/1988 | Japan . |
| 63-27476 | 11/1988 | Japan . |
| 1-308077 | 12/1989 | Japan . |
| 32084 | 1/1991 | Japan . |
| 3131020 | 6/1991 | Japan . |

*Primary Examiner*—Chandra Chaudhari
*Attorney, Agent, or Firm*—Hayes, Soloway, Hennessey, Grossman & Hage, P.C.

[57] ABSTRACT

An ion implantation method is provided, which is able to improve the controllability of implanted dopant ions and the uniformity in concentration and profile of implanted dopant ions. A semiconductor substrate with a (100)-oriented crystal surface is prepared. An elongated mask with a specific pattern is formed on the surface of the substrate. A beam of dopant ions is irradiated to the surface of the substrate along a first direction, thereby selectively implanting the dopant ions into the substrate using the mask. The first direction has a first angle with a normal of the surface of the substrate in a plane perpendicular to a longitudinal axis of the mask, where the first angle is in the range from 7° C. to 60° C. The first direction has a second angle with a lateral axis of the mask in a plane parallel to the surface of the substrate, where the second angle is in the range from 5° C. to 20° C. The longitudinal axis of the mask is parallel to one of the <011>-directions or one of the <0$\bar{1}$1>-directions.

13 Claims, 11 Drawing Sheets

ION IMPLANTATION METHOD USING TILTED ION BEAM

BACKGROUND OF THE INVENTION

1. Field of the Invention

The present invention relates to an ion implantation method used for semiconductor device fabrication and more particularly, to an ion implantation method for implanting dopant ions into a semiconductor substrate using a tilted ion beam.

2. Description of the Prior Art

"Ion implantation" is an essential technique in the semiconductor device fabrication field. Especially, for silicon semiconductor devices, it is extremely important to control the concentration, profile, and uniformity of dopant ions. Therefore, it has been required to improve the controllability in the ion implantation process. However, this controllability tends to be prevented from being realized by various causes.

A typical one of these causes is the "channeling effect" that channels (i.e., long-range open spaces) are formed in a crystalline target due to its regular arrangements of atoms, and that the implanted ions can travel through the channels without significant scattering, thereby extending the final ion distribution deeper into the target.

To prevent the channeling effect in the ion implantation, various improvements have been developed, one of which is disclosed in the Japanese Non-Examined Patent Publication No. 63-274767 published in Nov. 1988.

Figure 1:
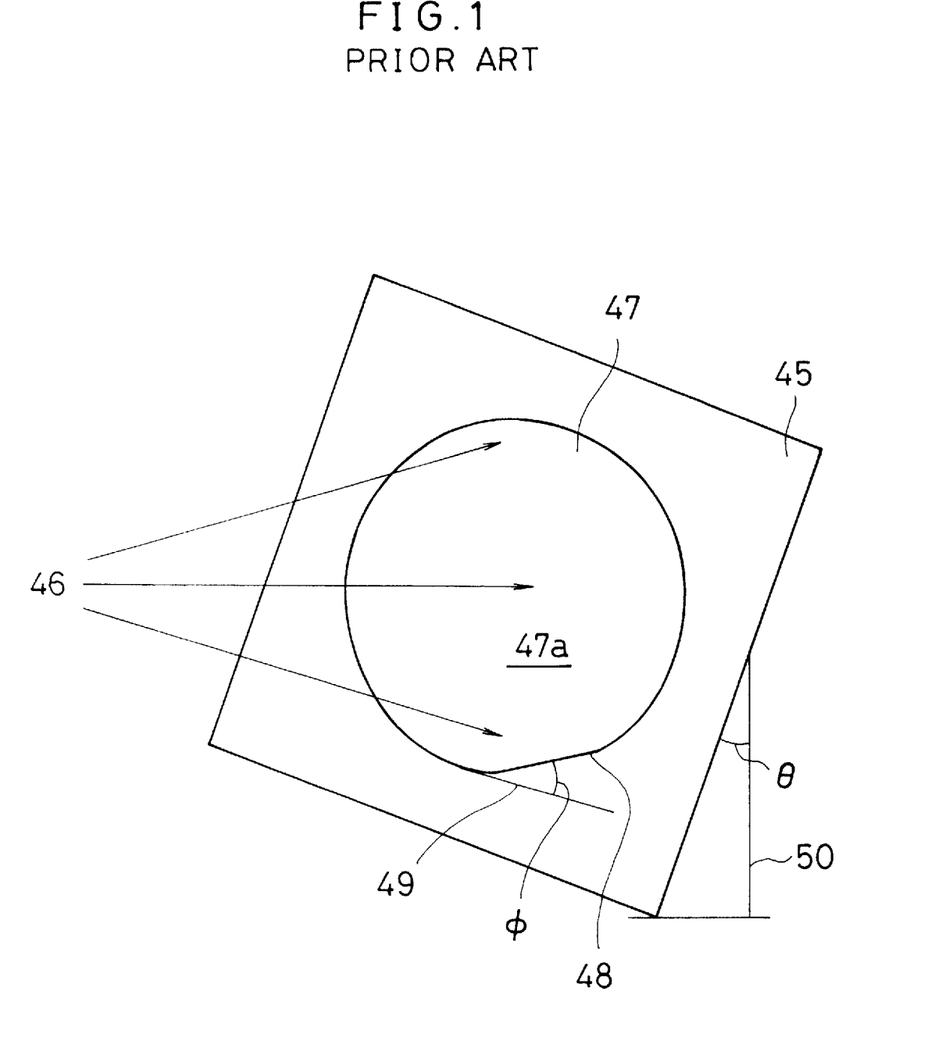
FIG. 1 is a schematic view showing a conventional ion implantation method, in which a semiconductor wafer is held on a wafer holder of an ion implantation system.

With the conventional ion implantation method disclosed in the Japanese Non-Examined Patent Publication No. 63-274767, as shown in FIG. 1, a semiconductor substrate or wafer 47 has a (100)-oriented crystal surface 47a and a (110)-oriented orientation flat 48. The substrate 47 is placed on a substrate or wafer holder 45 of an ion implantation system (not shown). The holder 45 (and therefore the substrate 47) is fixed to be tilted by an angle θ with respect to a vertical plane 50, where θ is set as approximately 7° C.

An ion beam 46 is irradiated to the crystal surface 47a of the substrate 47 along the horizontal plane 49. In other words, the beam 46 is tilted by the angle θ with respect to a normal perpendicular to the crystal surface 47a of the substrate 47.

The substrate 47 is held on the holder 45 in such a way that the orientation flat 48 is tilted by an angle φ with respect to a horizontal plane 49, where φ is set as 15° C. to 75° C.

If the angle φ is zero, i.e., the (110)-oriented orientation flat 48 of the substrate 47 is parallel to the horizontal plane 49, the "plane channeling effect" will occur, resulting in sheet resistance deviation of the substrate 47. However, with the conventional ion implantation method disclosed in the Japanese Non-Examined Patent Publication No. 63-274767, since the angle φ is set as 15° C. to 75° C., the plane channeling effect can be prevented from occurring.

Further, with the conventional ion implantation method disclosed in the Japanese Non-Examined Patent Publication No. 63-274767, four ion implantation steps are successively performed to the same substrate 47 while turning the substrate 47 around the normal of the surface 47a by 90° C. at each step.

Figure 2:
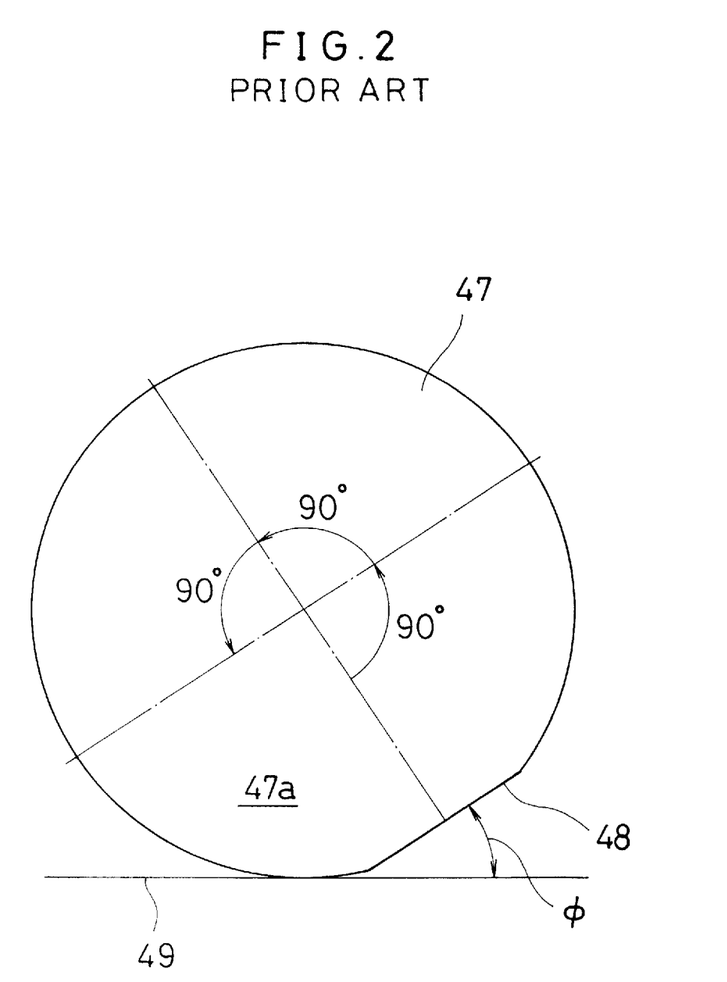
FIG. 2 is a schematic elevation of the wafer, which shows the conventional ion implantation method of FIG. 1.

Specifically, as shown in FIG. 2, the first step is performed at the angle of φ at a dose equal to a quarter of a wanted, total dose, where φ is 15° C. to 75° C. The second step is performed at the angle of (φ+90° C.) at a dose equal to a quarter of a wanted, total dose. The third step is performed at the angle of (φ+180° C.) at a dose equal to a quarter of a wanted, total dose. The fourth step is performed at the angle of (φ+270° C.) at a dose equal to a quarter of a wanted, total dose.

Thus, the uniformity of the obtainable dopant concentration in the substrate 47 can be further improved.

The conventional ion implantation method of FIGS. 1 and 2 is effective for the case where no miniaturized masking pattern is formed on the surface 47a of the substrate 47. However, this method is not effective for the following cases.

Specifically, when ion implantation is applied to the process of forming normal source/drain regions or source/drain regions with the Lightly-Doped Drain (LDD) structure of a Metal-Oxide-Semiconductor Field-Effect Transistor (MOSFET), dopant ions are selectively implanted into a semiconductor substrate using a gate electrode that has been formed on the substrate as a mask. Therefore, in this case, not only the implantation direction of the dopant ion but also the running direction of the gate electrode on the substrate needs to be considered.

In other words, when the gate electrode and a patterned resist mask allowing the selective ion-implantation exist on the surface of the substrate, it is preferred that the incident direction of the ion beam is set to be perpendicular to the running direction of the gate electrode. The reason is that if the incident direction of the ion beam is largely shifted from the direction perpendicular to the running direction of the gate electrode, the irradiation of the beam to the substrate tends to be disturbed by the patterned resist mask, thereby generating any unwanted region where no or less ions are implanted. This results in distribution non-uniformity of the implanted dopant ions in the substrate.

Typically, the running direction of the gate electrode on the (100)-oriented crystal surface of the substrate is set as the [011]-direction or the [0$\overline{1}$1]-direction.

Accordingly, with the conventional ion implantation method shown in FIGS. 1 and 2, to make the incident direction of the ion beam 46 as close as possible to the direction perpendicular to the running direction of the gate electrode, it is said that the angle φ of the (110)-oriented orientation flat 48 of the substrate 47 should be set as 15° C.

In this case where φ=15° C., if the substrate 47 is turned on the surface of the holder 45, which is fixed to be tilted by the angle θ with respect to the vertical plane 50, by 90° C. around the normal perpendicular to the surface 47a of the substrate 47 at every implantation steps, the ion beam 46 makes an angle of 75° C. or 15° C. with the gate electrode on the surface 47a of the substrate 47. This will cause the distribution non-uniformity of the dopant ions.

Also, due to the existence of the shift of the ion beam 46 with the direction perpendicular to the running direction of the gate electrode, some no- or less-implanted regions will be formed. This also will cause the distribution non-uniformity of the dopant ions.

Figure 3:
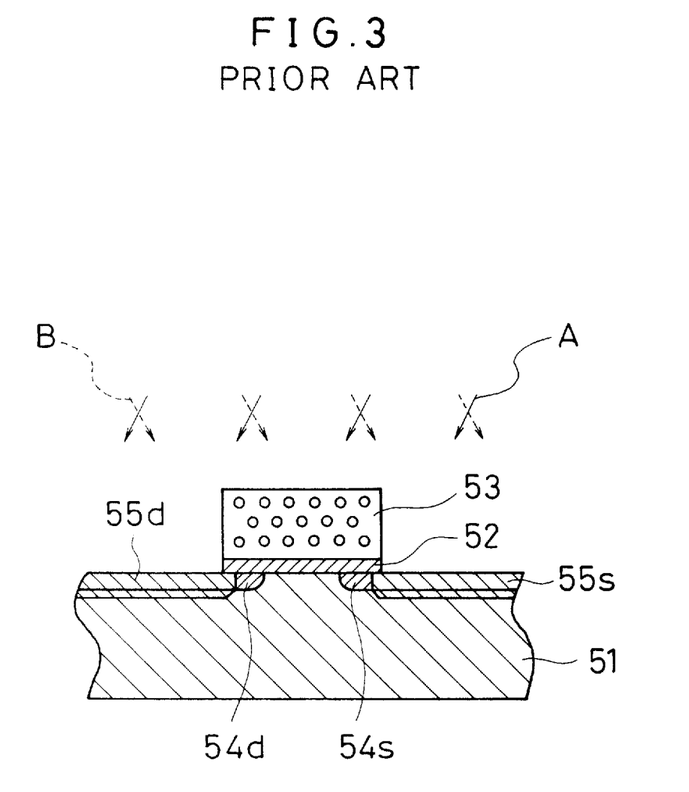
FIG. 3 is a schematic cross-section showing another conventional ion implantation method, in which a beam of dopant ions is irradiated to a main surface of a semiconductor substrate using a gate electrode as a mask.

Additionally, for ion-implantation of the source/drain regions with the LDD structure, another conventional ion implantation method as shown in FIG. 3 was developed, which is disclosed in the Japanese Non-Examined Patent Publication No. 63-95669 published in Apr. 1988.

In FIG. 3, a gate insulating layer 52 is formed on a main surface of a semiconductor substrate 51. A gate electrode 53 is formed on the gate insulating layer 52. A pair of source/drain regions with the LDD structure are formed in the substrate 51 in self-alignment with the gate electrode 53. The pair of source/drain regions are formed by ion implantation in the following manner.

In a first ion implantation step, a beam of dopant ions is irradiated along a direction A, which is perpendicular to the running direction of the gate electrode 53 and is tilted at a first angle in such a way that the dopant ions may enter the part below the gate electrode 53, where the first angle is set as, for example, 20° C.

In a second ion implantation step, the beam of dopant ions is irradiated along a direction B, which is perpendicular to the running direction of the gate electrode 53 and is tilted at the same first angle in such a way that the dopant ions may enter the part below the gate electrode 53.

Through the first and second ion implantation processes, lightly-doped source and drain regions 54s and 54d having a wanted dopant concentration are formed in the substrate 51.

In a third ion implantation step, the beam is irradiated along the direction A tilted by a second angle different from the first angle, where the second angle is set as, for example, 7° C.

In a fourth ion implantation step, the beam is irradiated along the direction B tilted by the same second angle.

Through the third and fourth ion implantation steps, heavily-doped source and drain regions 55s and 55d having a wanted dopant concentration greater than that of the lightly-doped source and drain regions 54s and 54d are formed in the substrate 51. The state at this stage is shown in FIG. 3.

With the conventional ion implantation method disclosed in the Japanese Non-Examined Patent Publication No. 63-95669 and shown in FIG. 3, however, there is a problem that the characteristics of the resultant MOSFET tend to fluctuate due to the non-uniformity of the dopant concentration. The reason is as follows:

As described previously, the running direction of the gate electrode 53 on the surface of the substrate 51 is typically the [011]-direction or the [0$\bar{1}$1>]-direction. Therefore, the "plane channeling effect" tends to occur, thereby making the resultant dopant profile non-uniform.

As described above, with the above conventional ion implantation methods of FIGS. 1 to 3, the concentration and profile of the implanted dopant ions tend to be non-uniform. How much this non-uniformity affects the characteristics of the MOSFET is dependent upon the thickness of the gate insulating layer 52 and the ion-implantation conditions. However, it is clear that the degree of the effect of the dopant non-uniformity increases with the decreasing thickness of the gate insulating layer 52 according to the progressing miniaturization of the semiconductor devices and with the increasing preciseness in control of the dopant profile.

SUMMARY OF THE INVENTION

Accordingly, an object of the present invention is to provide an ion implantation method that is able to improve the controllability of implanted dopant ions.

Another object of the present invention is to provide an ion implantation method that is able to improve the uniformity in concentration and profile of implanted dopant ions.

The above objects together with others not specifically mentioned will become clear to those skilled in the art from the following description.

An ion implantation method according to a first aspect of the present invention includes the following steps (a) to (c).

(a) A semiconductor substrate with a (100)-oriented crystal surface is prepared.

(b) An elongated mask with a specific pattern is formed on the surface of the substrate.

(c) A beam of dopant ions is irradiated to the surface of the substrate along a first direction, thereby selectively implanting the dopant ions into the substrate using the mask.

The first direction has a first angle with a normal of the surface of the substrate in a plane perpendicular to a longitudinal axis of the mask, where the first angle is in the range from 7° C. to 60° C.

The first direction has a second angle with a lateral axis of the mask in a plane parallel to the surface of the substrate, where the second angle is in the range from 5° C. to 20° C.

The longitudinal axis of the mask is parallel to one of the <011>-directions or one of the <0$\bar{1}$1>-directions.

With the ion implantation method according to the first aspect of the present invention, since the crystal surface of the substrate is oriented to the (100)-direction, this surface corresponds to a (100)-plane of the substrate. Therefore, the <011>- and <0$\bar{1}$1>-directions, which are perpendicular to each other, are parallel to the surface of the substrate.

A beam of dopant ions is irradiated to the (100)-surface of the substrate along a first direction, thereby selectively implanting the dopant ions into the substrate using an elongated mask formed on the (100)-surface of the substrate. The first direction has a first angle of 7° C. to 60° C. with a normal of the (100)-surface of the substrate in a plane perpendicular to a longitudinal axis of the mask. Also, the first direction has a second angle of 5° C. to 20° C. with a lateral axis of the mask in a plane parallel to the (100)surface of the substrate. The longitudinal axis of the mask is parallel to one of the <011>-directions or one of the <0$\bar{1}$1>-directions.

As a result, the "axial channeling effect" is prevented from occurring due to the limited first angle, and at the same time, the "plane channeling effect" is prevented from occurring due to the limited second angle. Thus, the controllability of the implanted dopant ions can be improved. This means that the uniformity in concentration and profile of the implanted dopant ions can be improved.

In a preferred embodiment of the method according to the first aspect, a step (d) is additionally provided after the step (c).

The step (d) is irradiating a beam of dopant ions to the surface of the substrate along a second direction, thereby selectively implanting the dopant ions into the substrate using the mask.

The second direction has the same first angle as that of the step (c). Also, the second direction has a third angle with the lateral axis of the mask in the plane parallel to the surface of the substrate, where the third angle is in the range from 5° C. to 20° C., and is on an opposite side to that of the first angle with respect to the lateral axis of the mask.

In the step (d), it is preferred that the beam of dopant ions is irradiated to the substrate from the same side of the mask as that of the step (c). It is preferred that the third angle is equal to the first angle.

In this case, since the dopant ions are implanted into the substrate on the opposite sides of the lateral axis of the mask, respectively, there is an additional advantage that the distribution non-uniformity of the dopant ions can be further improved.

In another preferred embodiment of the method according to the first aspect, the steps (c) and (d) are performed again to irradiate on an opposite side of the mask to that in the steps (c) and (d) . Thus, the dopant ions are implanted into the substrate on the both sides of the mask.

In this case, the distribution of the dopant ions can be uniform on the both side of the mask.

In still another preferred embodiment of the method according to the first aspect, the mask is a gate electrode of a MOSFET, and a pair of source/drain regions are formed in the substrate at each side of the gate electrode.

In this case, the ion implantation method according to the first aspect is effectively applied.

In a further preferred embodiment of the method according to the first aspect, a pair of sidewall spacers are additionally formed on each side of the gate electrode. The first angle is in the range from 50° C. to 60° C.

In this case, the ion implantation method according to the first aspect is effectively applied to fabrication of the MOSFET with the LDD structure.

As described above, in the method according to the first aspect, the first angle is in the range from 70° C. to 60° C. If the first angle is less than 7° C., the channeling effect cannot be effectively prevented from occurring. If the first angle is greater than 60° C., a semiconductor device to which this method is applied tends to have unsatisfactory characteristics.

Similarly, the second angle is in the range from 5° C. to 20° C. in the method according to the first aspect. If the second angle is less than 5° C., the channeling effect cannot be effectively prevented from occurring. The minimum value of the second angle is 3° C., and the value of 2° C. is added as its tolerance.

If the second angle is greater than 20° C., the implanted dopant ions into the substrate tends to have unsatisfactory profile, because the ions become difficult to enter the location below the mask. Thus, a semiconductor device to which this method is applied tends to have unsatisfactory characteristics such as ON-current, threshold voltage, and leakage current.

An ion implantation method according to a second aspect of the present invention includes the following steps (a) to (c)

(a) A semiconductor substrate with a (100)-oriented crystal surface is prepared.

(b) An elongated mask with a specific pattern is formed on the surface of the substrate. The mask has a longitudinal axis having a first angle with one of the <011>-directions or one of the <0$\bar{1}$1>-directions, where the first angle is in the range from 5° C. to 20° C.

(c) A beam of dopant ions is irradiated to the surface of the substrate along a first direction, thereby selectively implanting the dopant ions into the substrate using the mask.

The first direction has a second angle with a normal of the surface of the substrate in a plane perpendicular to a longitudinal axis of the mask, where the second angle is in the range from 7° C. to 60° C.

The first direction is approximately perpendicular to the longitudinal axis of the mask.

With the ion implantation method according to the second aspect of the present invention, unlike the method according to the first aspect, a longitudinal axis of an elongated mask has a first angle with one of the <011>-directions or one of the <0$\bar{1}$1>-directions, where the first angle is in the range from 5° C. to 20° C.

In other words, in the method according to the second aspect, the mask is formed on the surface of the substrate to be inclined at the first angle of 5° C. to 20° C. with respect to one of the <011>-directions or one of the <0$\bar{1}$1>-directions.

Further, the beam of dopant ions is irradiated to the (100)-surface of the substrate along the first direction, thereby selectively implanting the dopant ions into the substrate using the mask. The first direction has a second angle with a normal of the surface of the substrate in a plane perpendicular to a longitudinal axis of the mask, where the second angle is in the range from 7° C. to 60° C. The first direction is approximately perpendicular to the longitudinal axis of the mask.

As a result, the "axial channeling effect" is prevented from occurring due to the limited second angle of the mask, and at the same time, the "plane channeling effect" is prevented from occurring due to the limited first angle of the beam. Thus, similar to the method according to the first aspect, the controllability of the implanted dopant ions can be improved. This means that the uniformity in concentration and profile of the implanted dopant ions can be improved.

In a preferred embodiment of the method according to second aspect, the substrate has an orientation indicator (for example, an orientation flat or notch), which is or is not in accordance with the longitudinal axis of the mask.

In this case, there is an additional advantage that the substrate can be readily placed on a substrate holder of an ion implantation system for the purpose of the ion implantation method according to the second aspect.

In another preferred embodiment of the method according to the second aspect, a step (d) is additionally provided after the step (c).

The step (d) is irradiating a beam of dopant ions to the surface of the substrate along a second direction on an opposite side of the mask to the step (c), thereby selectively implanting the dopant ions into the substrate using the mask. The second direction has the same first angle as that of the step (c). Thus, the dopant ions are implanted into the substrate on the both sides of the mask.

In this case, since the dopant ions are implanted into the substrate on the opposite sides of the lateral axis of the mask, respectively, there is an additional advantage that the distribution non-uniformity of the dopant ions can be further improved.

In still another preferred embodiment of the method according to the second aspect, the mask is a gate electrode of a MOSFET, and a pair of source/drain regions are formed in the substrate at each side of the gate electrode.

In this case, the ion implantation method according to the second aspect is effectively applied.

In a further preferred embodiment of the method according to the second aspect, a pair of sidewall spacers are additionally formed on each side of the gate electrode. The first angle is in the range from 50° C. to 60° C.

In this case, the ion implantation method according to the second aspect is effectively applied to fabrication of the MOSFET with the LDD structure.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Preferred embodiments of the present invention will be described below referring to the drawings attached.

FIRST EMBODIMENT

Figure 4:
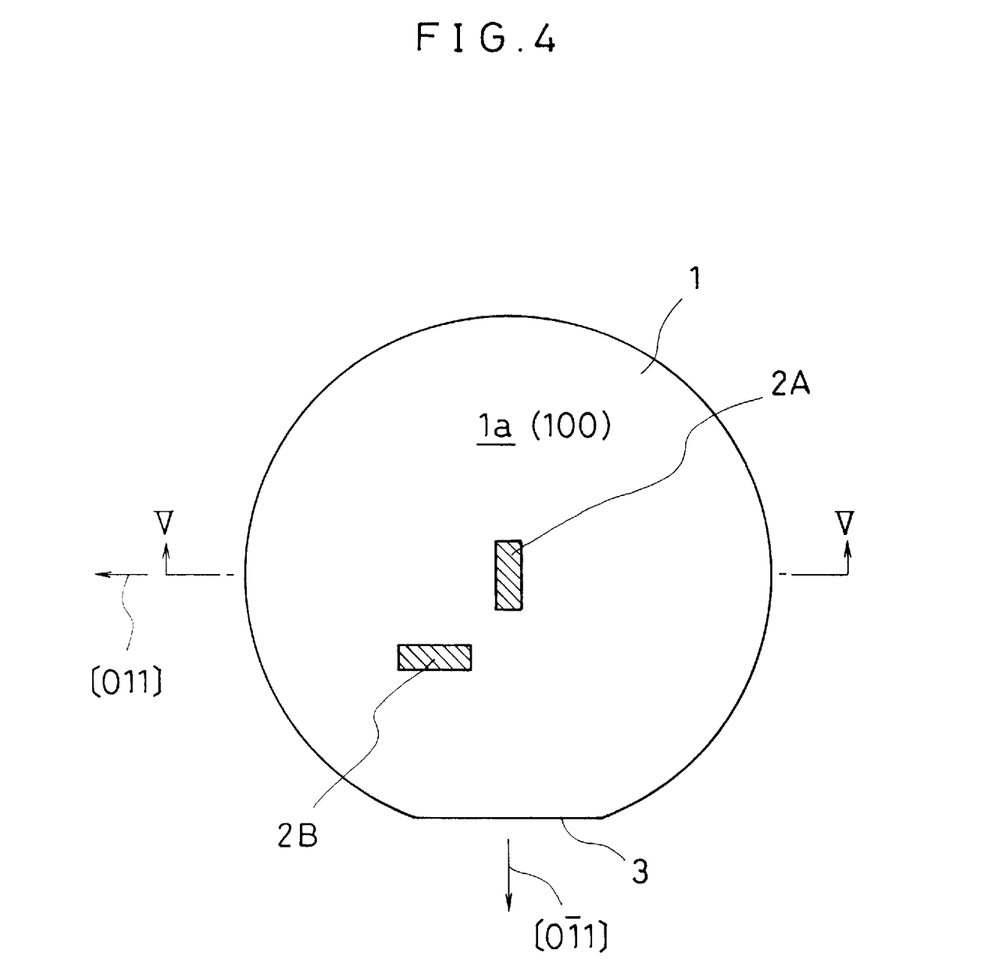
FIG. 4 is a schematic view of a semiconductor wafer, which shows an ion implantation method according to a first embodiment of the present invention.

In an ion implantation method according to a first embodiment of the present invention, a semiconductor wafer or substrate 1 of silicon as shown in FIG. 4 is used. In FIG. 4, the substrate 1 has a (100)-oriented crystal surface 1a, two gate electrodes 2A and 2B formed on the surface 1a, and an orientation flat 3 formed on the side face of the substrate 1.

Here, the orientation flat 3 is oriented in the [0 $\bar{1}$1]-direction.

It is needless to say that the orientation flat 3 may be replaced with an orientation notch.

The gate electrode 2A extends along the [0 $\bar{1}$1]-direction. In other words, the longitudinal axis of the gate electrode 2A is parallel to the [0$\bar{1}$1]-direction. Since the orientation flat 3 is oriented in the [0$\bar{1}$1]-direction, the gate electrode 2A is perpendicular to the orientation flat 3.

The gate electrode 2B extends along the [011]direction, which is perpendicular to the [0$\bar{1}$1]-direction. In other words, the longitudinal axis of the gate electrode 2B is parallel to the [011]-direction. The gate electrode 2B is parallel to the orientation flat 3.

The gate electrode 2B is equivalent to the gate electrode 2A except for its running or extending direction and therefore, the ion implantation process for the gate electrode 2A is only explained here for the sake of simplification of description.

Figure 5:
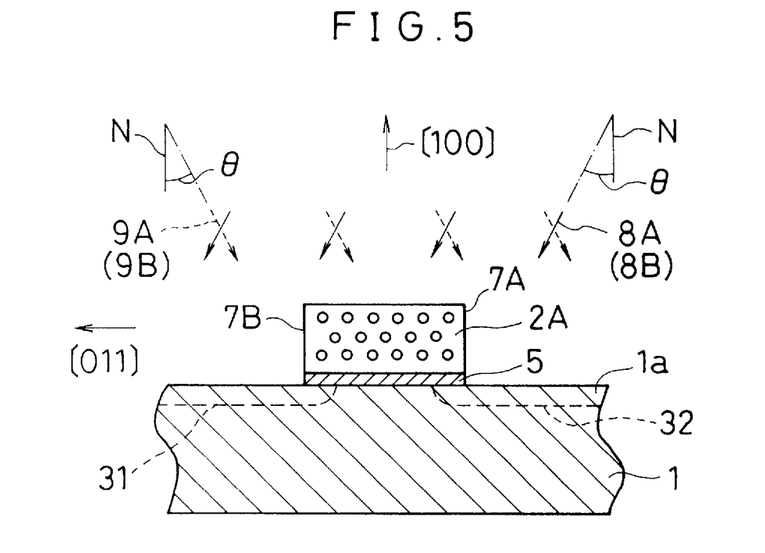
FIG. 5 is a schematic, partial, enlarged, cross-sectional view along the line V—V in FIG. 4.
Figure 6:
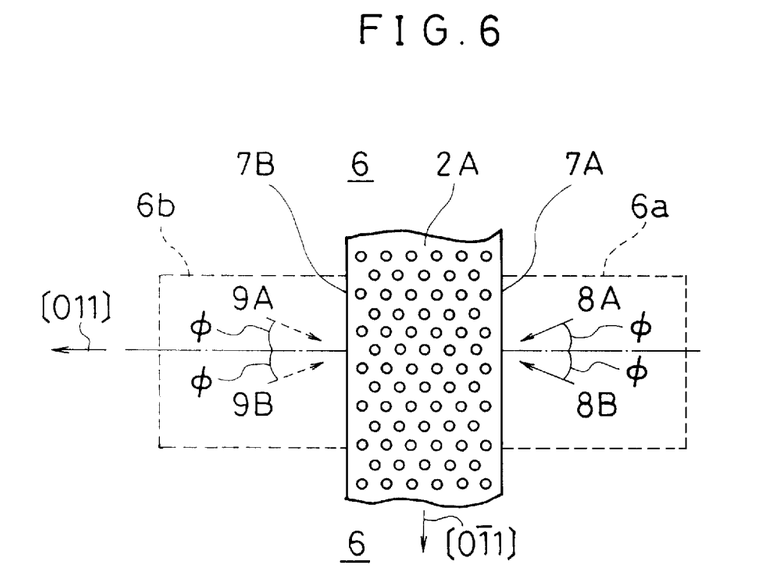
FIG. 6 is a schematic, partial, enlarged, plan view showing the structure of FIG. 5.

As shown in FIGS. 5 and 6, a gate insulating layer 5 is formed on the surface 1a of the substrate 1. The gate electrode 2A is formed on the gate insulating layer 5.

The main surface 1a of the substrate 1 is covered with a patterned resist mask 6 with two rectangular penetrating windows 6a and 6b through which a pair of source/drain regions 31 and 32 are formed in the substrate 1. The windows 6a and 6b are located at each side of the gate electrode 2A corresponding to the source/drain regions 31 and 32, respectively.

Next, the ion implantation method according to the first embodiment is explained below:

As a first step, a beam of dopant ions is irradiated to the surface 1a of the substrate 1 along a first direction 8A from a side 7A of the gate electrode 2A. Thus, the dopant ions are selectively implanted into the substrate 1 in self-alignment with the gate electrode 2A and the resist mask 6.

The first direction 8A has an angle θ with a normal N of the surface 1a of the substrate 1 in a plane parallel to the lateral axis of the gate electrode 2A. The normal N is in the [100]-direction. The lateral axis is in the [011]-direction. Here, the angle θ is set as a value within the range from 7° C. to 60° C.

The first direction 8A has an angle φ with the lateral axis of the gate electrode 2A in a plane parallel to the surface 1a of the substrate 1. Here, the angle φ is set as a value within the range from 5° C. to 20° C.

As a second step, a beam of the same dopant ions as that of the first step is irradiated to the surface 1a of the substrate 1 in a second direction 8B from the same side 7A of the gate electrode 2A as that of the first step. Thus, the dopant ions are selectively implanted into the substrate 1 in self-alignment with the gate electrode 2A and the resist mask 6.

The second direction 8B has the same angle θ as that of the first direction 8A with the normal N of the surface 1a in the plane parallel to the lateral axis of the gate electrode 2A. Here, the angle θ is set as the same value as that of the first direction 8A.

As a third step, a beam of the same dopant ions as that of the first step is irradiated to the surface 1a of the substrate 1 in a third direction 9A from an opposite side 7B of the gate electrode 2A as that of the first step. Thus, the dopant ions are selectively implanted into the substrate 1 in self-alignment with the gate electrode 2A and the resist mask 6.

The third direction 9A has the same angle θ as that of the first direction 8A with the normal N of the surface 1a in the plane parallel to the lateral axis of the gate electrode 2A. Here, the angle θ is set as the same value as that of the first direction 8A.

As a fourth step, a beam of the same dopant ions as that of the first step is irradiated to the surface 1a of the substrate 1 in a fourth direction 9B from the same side 7B of the gate electrode 2A as that of the third step. Thus, the dopant ions are selectively implanted into the substrate 1 in self-alignment with the gate electrode 2A and the resist mask 6.

The fourth direction 9B has the same angle θ as that of the first direction 8A with the normal N of the surface 1a in the plane parallel to the lateral axis of the gate electrode 2A. Here, the angle θ is set as the same value as that of the first direction 8A.

Through the first to fourth steps, the ion implantation for the gate electrode 7A is finished, resulting in the source/drain regions 31 and 32 in the substrate 1.

For the gate electrode 2B, the same first to fourth steps are performed, resulting in the source/drain regions (not shown) with a wanted dopant concentration in the substrate 1.

Thus, the ion implantation method according to the first embodiment is finished.

As seen from the above description, eight steps in total are necessary for forming the pair of source/drain regions 31 and 32 in the method according to the first embodiment.

Here, although the gate electrodes 2A and 2B are formed to extend along the [0$\bar{1}$1]- and [011]-directions, respectively, it is needless to say that the gate electrodes may be formed to extend directions other than the [0$\bar{1}$1]- and [011]-directions. However, it is typical that almost all of the gate electrodes requiring the precise control of the MOSFET characteristics (or, the dopant distribution) extend along the [0$\bar{1}$1]- or [011]-direction. Accordingly, satisfactory uniformity of the implanted dopant ions can be obtained in practical use through these eight steps.

The angle θ of the tilted direction of the beam with respect to the normal N may be set as a suitable value according to the wanted characteristics of the MOSFET. In the first embodiment, the angle θ is set as a value ranging from 7° C. to 10° C. in order to make it possible to prevent the channeling effect from occurring.

With the ion implantation method according to the first embodiment, since the surface 1a of the substrate 1 is oriented to the (100)-direction, this surface 1a corresponds to a (100)-plane of the substrate 1. Therefore, the <011>and <0$\bar{1}$1>-directions, which are perpendicular to each other, are parallel to the surface of the substrate.

A beam of dopant ions is irradiated to the (100)-surface 1a of the substrate 1 along the first direction 8A in the first step, thereby selectively implanting the dopant ions into the substrate 1 using the gate electrode 2A as a mask. The first direction 8A has the first angle of 7° C. to 60° C. with the normal of the (100)-surface 1a of the substrate 1 in the plane perpendicular to the longitudinal axis of the gate electrode 2A. Also, the first direction 8A has the second angle of 5° C. to 20° C. with the lateral axis of the gate electrode 2A in the plane parallel to the (100)-surface 1a of the substrate 1. The longitudinal axis of the gate electrode 2A is parallel to the [0$\bar{1}$1]-direction.

In the subsequent second to fourth steps, a beam of dopant ions is irradiated to the (100)-surface 1a of the substrate 1 in the same manner as that of the first step along the second, third, and fourth directions 8B, 9A, and 9B, respectively.

As a result, the "axial channeling effect" is prevented from occurring due to the limited first angle θ, and at the same time, the "plane channeling effect" is prevented from occurring due to the limited second angle φ. Thus, the controllability of the implanted dopant ions can be improved. This means that the uniformity in concentration and profile of the implanted dopant ions can be improved.

Thus, the method according to the first embodiment can be applied to fabrication of a high-performance MOSFETs.

To confirm the advantages in the method according to the first embodiment, the threshold voltage fluctuation of the MOSFET was measured by the inventor.

In the ion implantation method according to the first embodiment, the threshold voltage has a maximum fluctuation of approximately 35 mV, which is satisfactorily low. The reason is that the angle φ is set as a small value of 5° C. to 20° C., and that the ion implantation processes are performed at the different directions 8A and 8B for the side 7A of the gate electrode 2A and the different directions 9A and 9B for the side 7B thereof.

On the other hand, in the conventional ion implantation method disclosed in the Japanese Non-Examined Patent Publication No. 63-274767 and shown in FIGS. 1 and 2, the threshold voltage has a maximum fluctuation of approximately 100 mV. In this case, the angle φ is set as 45° C., which is stated as an optimum value in the same Publication.

It is supposed that this large fluctuation is caused by non-uniformity of the implanted dopant ions. The non-uniformity is due to the fact that four ion implantation steps are successively performed to the same substrate 47 while turning the substrate 47 around the normal perpendicular to the surface 47a by 90° C. at each step.

SECOND EMBODIMENT

Figure 9:
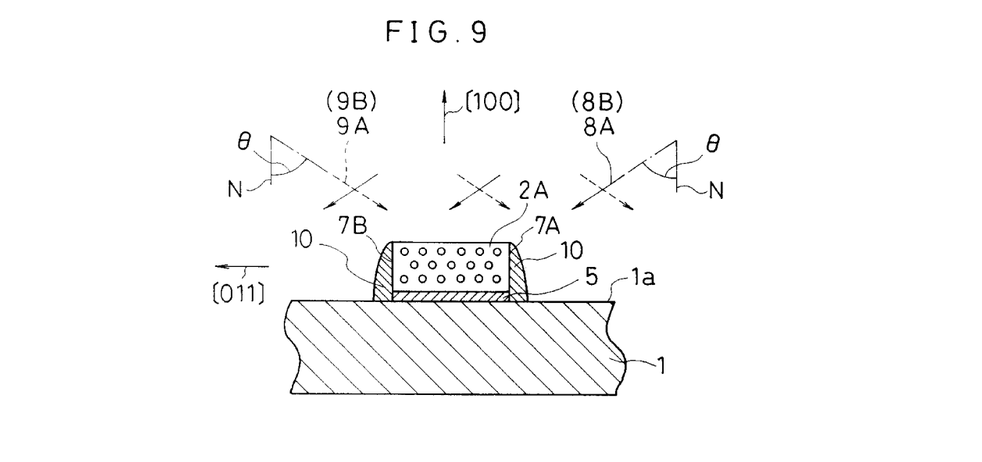
FIG. 9 is a schematic, partial, enlarged, cross-sectional view, which shows an ion implantation method according to a second embodiment of the present invention.
Figure 10:
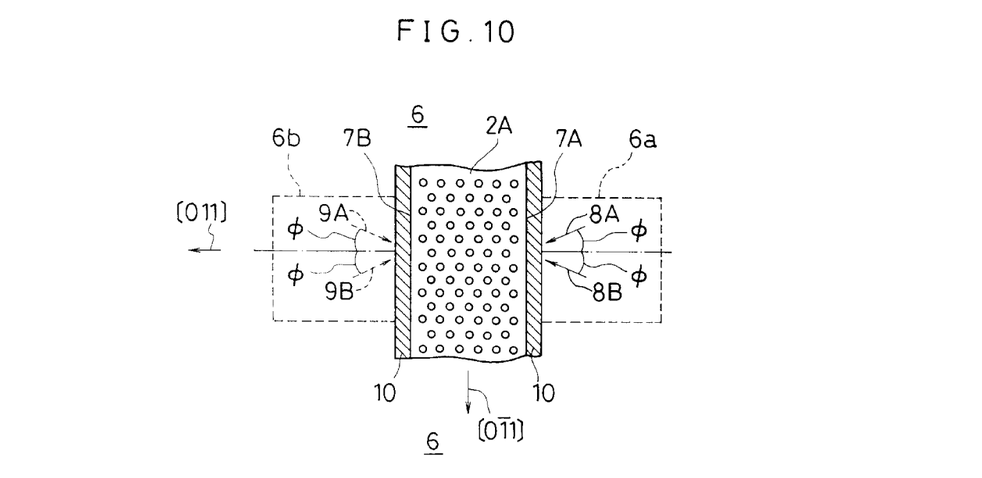
FIG. 10 is a schematic, partial, enlarged, plan view showing the structure of FIG. 9.

An ion implantation method according to a second embodiment is shown in FIGS. 9 and 10, which includes the same steps as those in the first embodiment except that a step of forming a pair of sidewall spacers 10 at each side of the gate electrode 2A is additionally provided, and that the angle θ is set as a large value of 50° C. to 60° C.

Therefore, the description relating to the same processes is omitted here for the sake of simplification by adding the same reference numerals to the corresponding elements in FIGS. 9 and 10.

The pair of sidewall spacers 10 serves to decrease the necessary number of the process steps.

Since the angle θ is set as a large value of 50° C. to 60° C., the dopant ions can be implanted into the substrate 1 in such a way that the profile of the implanted dopant ions extends to the location near the center of the gate electrode 2A.

The MOSFET thus formed has the LDD structure.

THIRD EMBODIMENT

Figure 11:
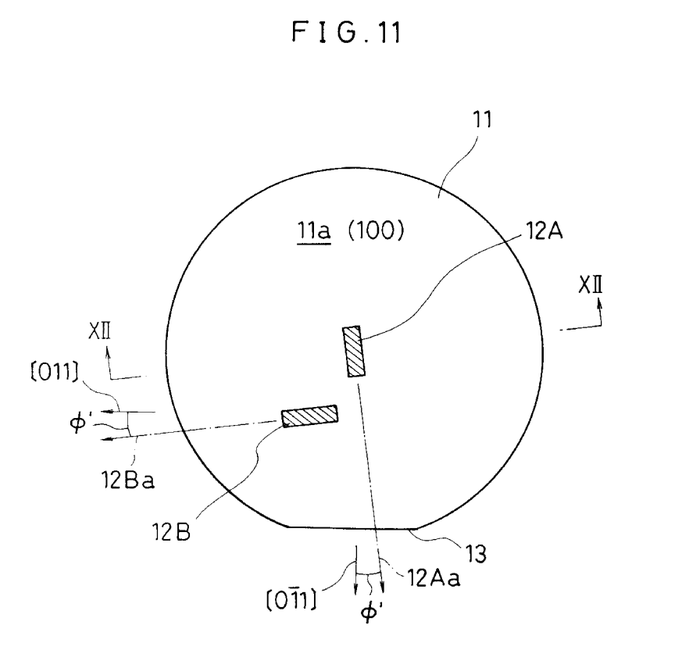
FIG. 11 is a schematic view of a semiconductor wafer, which shows an ion implantation method according to a third embodiment of the present invention.
Figure 12:
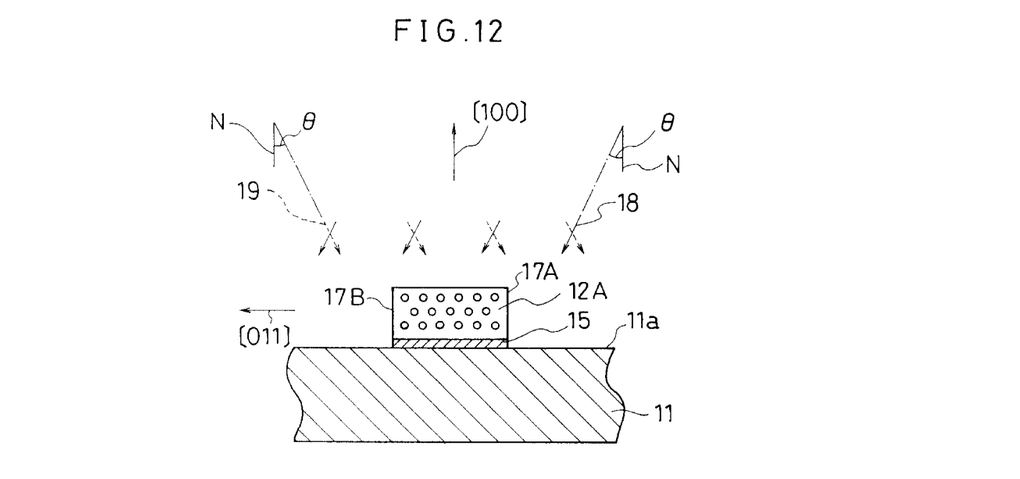
FIG. 12 is a schematic, partial, enlarged, cross-sectional view along the line XII—XII in FIG. 11.
Figure 13:
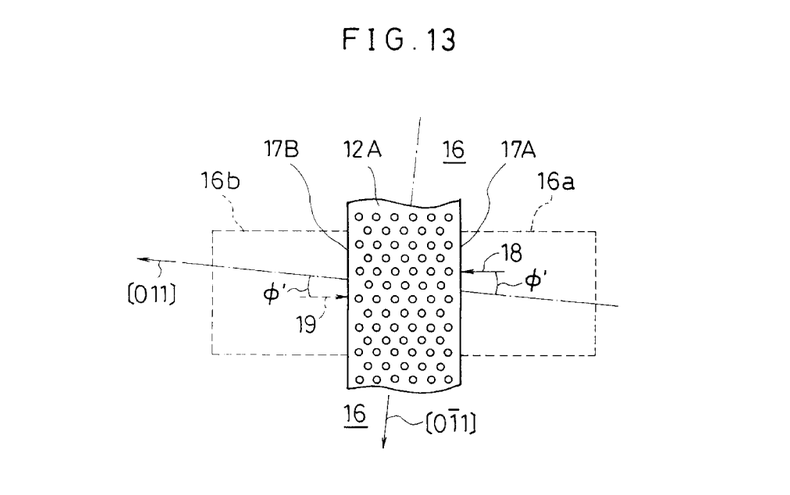
FIG. 13 is a schematic, partial, enlarged, plan view showing the structure of FIG. 12.

FIGS. 11, 12, and 13 shows an ion implantation method according to a third embodiment of the present invention.

In FIG. 11, a semiconductor wafer or substrate 11 of silicon has a (100)-oriented crystal surface 11a, two gate electrodes 12A and 12B formed on the surface 11a, and an orientation flat 13 formed on the side face of the substrate 11.

Here, the orientation flat 13 is oriented in the [0$\bar{1}$1]-direction.

It is needless to say that the orientation flat 13 may be replaced with an orientation notch.

The gate electrode 12A extends along a direction tilted by an angle φ with respect to the [0$\bar{1}$1]-direction in the surface 11a. In other words, the longitudinal axis 12Aa of the gate electrode 12A has an angle φ' with the [0$\bar{1}$1]-direction. Since the orientation flat 13 has oriented in the [0$\bar{1}$1]-direction, the gate electrode 12A is perpendicular to the orientation flat 13.

The gate electrode 12B extends along a direction tilted by the same angle φ' with respect to the [0$\bar{1}$1]-direction, which is perpendicular to the [0$\bar{1}$1]-direction. In other words, the longitudinal axis 12Ba of the gate electrode 12B has an angle φ' with the [011]-direction.

Here, the angle φ' is set as a value within the range from 5° C. to 20° C.

The gate electrode 12B is equivalent to the gate electrode 12A except for its running or extending direction and therefore, the ion implantation process for the gate electrode 12A is only explained here for the sake of simplification of description.

As shown in FIGS. 12 and 13, a gate insulating layer 15 is formed on the surface 11a of the substrate 11. The gate electrode 12A is formed on the gate insulating layer 15.

The main surface 11a of the substrate 11 is covered with a patterned resist mask 16 with two rectangular penetrating windows 16a and 16b through which a pair of source/drain regions and are formed in the substrate 11. The windows 16a and 16b are located at each side of the gate electrode 12A corresponding to the source/drain regions, respectively.

Next, the ion implantation method according to the third embodiment is explained below:

As a first step, a beam of dopant ions is irradiated to the surface 11a of the substrate 11 along a first direction 18 from a side 17A of the gate electrode 12A. Thus, the dopant ions are selectively implanted into the substrate 11 in self-alignment with the gate electrode 12A and the resist mask 16.

The first direction 18A has an angle θ with respect to a normal N of the surface 11a of the substrate 11 in a plane parallel to the lateral axis of the gate electrode 2A. The normal N is in the [100]-direction. The lateral axis is in the [011]-direction. Here, the angle θ is set as a value within the range from 7° C. to 60° C.

The first direction 18 has an angle φ' with the lateral axis of the gate electrode 12A in a plane parallel to the surface 11a of the substrate 11. Here, the angle φ' is set as a value within the range from 5° C. to 20° C.

As a second step, a beam of the same dopant ions as that of the first step is irradiated to the surface 11a of the substrate 11 in a second direction 19 from an opposite side 17B of the gate electrode 12A as that of the first step. Thus, the dopant ions are selectively implanted into the substrate 11 in self-alignment with the gate electrode 12A and the resist mask 16.

The second direction 19 has the same angle θ as that of the first direction 18 with the normal N of the surface 11a in the plane parallel to the lateral axis of the gate electrode 2A. Here, the angle θ is set as the same value as that of the first direction 18.

Through the first and second steps, the ion implantation for the gate electrode 17A is finished, resulting in the source/drain regions and in the substrate 11.

For the gate electrode 12B, the same first and second steps are performed, resulting in the source/drain regions (not shown) in the substrate 11.

Thus, the ion implantation method according to the third embodiment is finished.

As seen from the above description, four steps in total are necessary for forming the pair of source/drain regions in the method according to the third embodiment.

Here, the gate electrodes 12A and 12B are formed to extend along the directions tilted at the same angle φ' to the [0$\bar{1}$1]- and [011]-directions, respectively. However, the gate electrodes may be formed to extend directions other than these two directions.

The angle θ of the tilted direction of the beam with respect to the normal N may be set as a suitable value according to the wanted characteristics of the MOSFET. In the third embodiment, the angle θ is set as a value ranging from 7° C. to 10° C. in order to make it possible to prevent the channeling effect from occurring.

As described above, with the ion implantation method according to the third embodiment, the gate electrodes 12A and 12B are formed to be inclined to the [0$\bar{1}$1]- and [011]-directions, respectively, instead of the incident direction of the dopant ions. Therefore, the same advantages as those in the first embodiment is obtained.

Further, there is an additional advantage that the ion implantation into the substrate 21 can be finished using the conventional, popular ion implantation method without changing any ion-implantation conditions, if the running direction of the gate electrodes 12A and 12B are changed as above.

FOURTH EMBODIMENT

Figure 14:
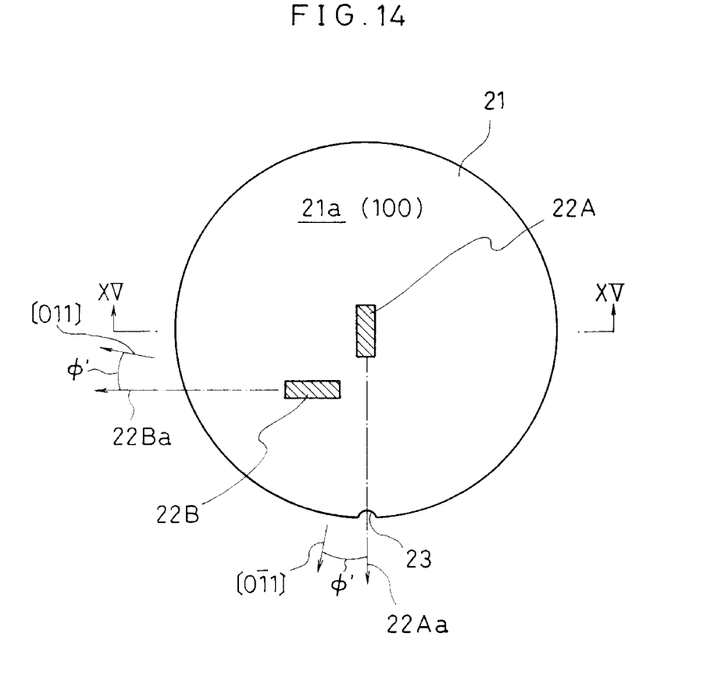
FIG. 14 is a schematic view of a semiconductor wafer, which shows an ion implantation method according to a fourth embodiment of the present invention.
Figure 15:
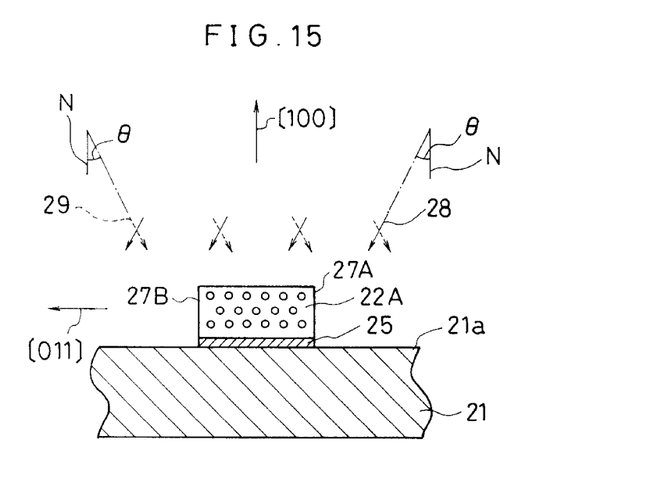
FIG. 15 is a schematic, partial, enlarged, cross-sectional view along the line XV—XV in FIG. 14.
Figure 16:
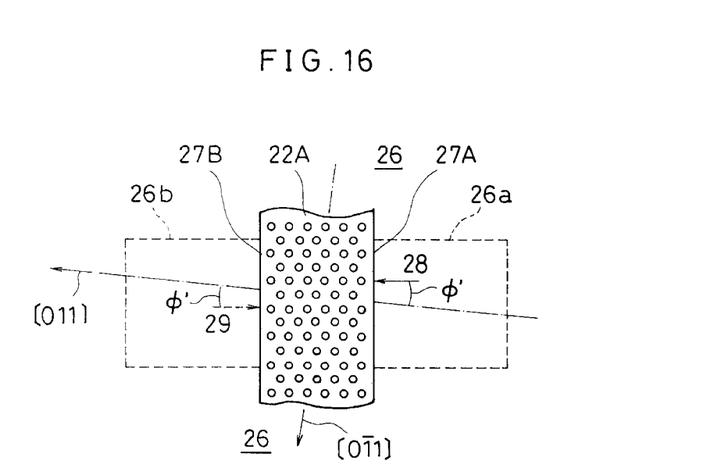
FIG. 16 is a schematic, partial, enlarged, plan view showing the structure of FIG. 15.

FIGS. 14, 15, and 16 shows an ion implantation method according to a fourth embodiment of the present invention.

In FIG. 14, a semiconductor wafer or substrate 21 of silicon has a (100)-oriented crystal surface 21a, two gate electrodes 22A and 22B formed on the surface 21a, and an orientation notch 23 formed on the side face of the substrate 21.

Here, the orientation notch 23 is oriented in the [0$\bar{1}$1]-direction.

It is needless to say that the orientation flat 23 may be replaced with an orientation flat.

The gate electrode 22A extends along a direction tilted by an angle φ' with respect to the [0$\bar{1}$1]-direction in the surface 21a. In other words, the longitudinal axis 22Aa of the gate electrode 22A has an angle φ' with the [0$\bar{1}$1]-direction.

The gate electrode 22B extends along a direction tilted by the same angle φ' with respect to the [011]-direction, which is perpendicular to the [0$\bar{1}$1]-direction. In other words, the longitudinal axis 22Ba of the gate electrode 22B has an angle φ' with the [011]-direction.

Here, the angle φ' is set as a value within the range from 5° C. to 20° C.

The gate electrode 22B is equivalent to the gate electrode 22A except for its running or extending direction and therefore, the ion implantation process for the gate electrode 22A is only explained here for the sake of simplification of description.

As shown in FIGS. 15 and 16, a gate insulating layer 25 is formed on the surface 21a of the substrate 21. The gate electrode 22A is formed on the gate insulating layer 25.

The main surface 21a of the substrate 21 is covered with a patterned resist mask 26 with two rectangular penetrating windows 26a and 26b through which a pair of source/drain regions and are formed in the substrate 21. The windows 26a and 26b are located at each side of the gate electrode 12A corresponding to the source/drain regions, respectively.

Next, the ion implantation method according to the fourth embodiment is explained below:

As a first step, a beam of dopant ions is irradiated to the surface 21a of the substrate 21 along a first direction 28 from a side 27A of the gate electrode 22A. Thus, the dopant ions are selectively implanted into the substrate 21 in self-alignment with the gate electrode 22A and the resist mask 26.

The first direction 28A has an angle θ with respect to a normal N of the surface 21a of the substrate 21 in a plane parallel to the lateral axis of the gate electrode 22A. The normal N is in the [100]-direction. The lateral axis is in the [011]-direction. Here, the angle θ is set as a value within the range from 7° C. to 60° C.

The first direction 28 has an angle φ' with the lateral axis of the gate electrode 22A in a plane parallel to the surface 21a of the substrate 21. Here, the angle φ' is set as a value within the range from 50° C. to 200° C.

As a second step, a beam of the same dopant ions as that of the first step is irradiated to the surface 21a of the substrate 21 in a second direction 29 from an opposite side 27B of the gate electrode 22A as that of the first step. Thus, the dopant ions are selectively implanted into the substrate 21 in self-alignment with the gate electrode 22A and the resist mask 26.

The second direction 29 has the same angle θ as that of the first direction 28 with the normal N of the surface 11a in the plane parallel to the lateral axis of the gate electrode 22A. Here, the angle θ is set as the same value as that of the first direction 28.

Through the first and second steps, the ion implantation for the gate electrode 27A is finished, resulting in the source/drain regions and in the substrate 21.

For the gate electrode 22B, the same first and second steps are performed, resulting in the source/drain regions (not shown) in the substrate 21.

Thus, the ion implantation method according to the fourth embodiment is finished.

As seen from the above description, four steps in total are necessary for forming the pair of source/drain regions in the method according to the fourth embodiment.

Here, the gate electrodes 22A and 22B are formed to extend along the [0$\bar{1}$1]- and [011]-directions, respectively. However, gate electrodes may be formed to extend directions other than the [0$\bar{1}$1]- and [011]-directions.

The angle θ of the tilted direction of the beam with respect to the normal N may be set as a suitable value according to the wanted characteristics of the MOSFET. In the fourth embodiment, the angle θ is set as a value ranging from 7° C. to 10° C. in order to make it possible to prevent the channeling effect from occurring. An optimum value that the angle θ is set as a value ranging from 10° C.

With the ion implantation method according to the fourth embodiment, there is an additional advantage that the ion implantation into the substrate 21 can be finished using the conventional ion implantation method, together with the same advantages as those in the first embodiment.

To confirm the advantages in the method according to the fourth embodiment, the sheet-resistance uniformity within the wafer 21 was measured by the inventor using the four-point probe measurement. This test was performed under the condition that phosphorus (P) was used as the dopant and the acceleration energy was set as 30 keV, and that the ion-implanted substrate 21 was subjected to a heat treatment at a temperature of 850° C. for 30 minutes.

Figure 7:
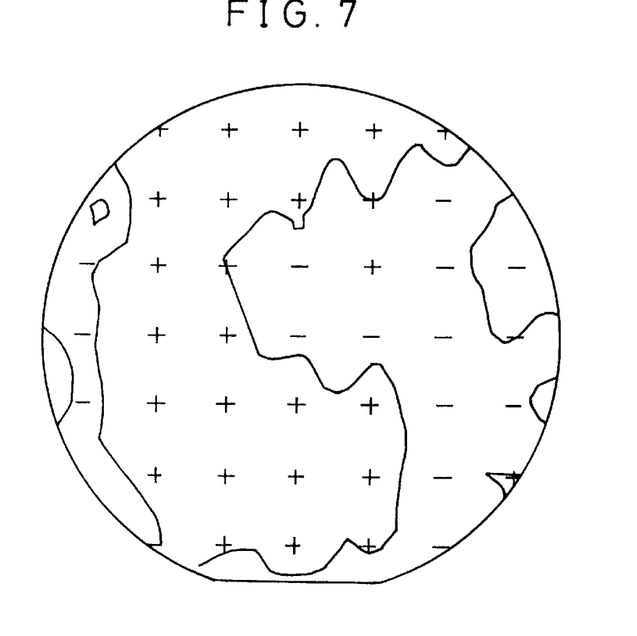
FIG. 7 is a sheet resistance map of a semiconductor wafer obtained by the ion implantation method according to the present invention.
Figure 8:
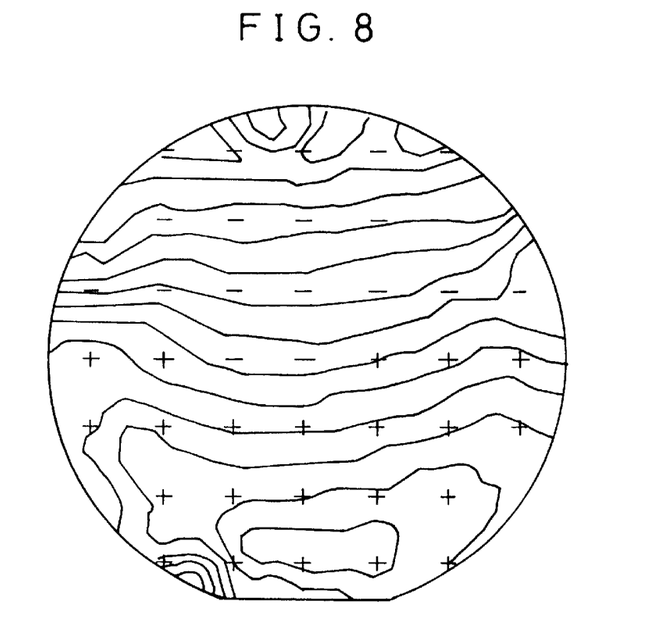
FIG. 8 is a sheet resistance map of a semiconductor wafer obtained by the conventional ion implantation method of FIG. 3.

The results of the ion implantation method according to the fourth embodiment are shown in FIG. 7 and those of the conventional ion implantation method of FIG. 3 is shown in FIG. 8, where the adjacent two contours indicate the 1% difference in sheet resistance.

It is found from FIG. 8 that the sheet resistance fluctuation with the conventional method is approximately ±10% or less. On the other hand, it is found from FIG. 7 that the sheet resistance fluctuation with the fourth embodiment is suppressed to approximately ±1.5% or less.

As described above, with the ion implantation method according to the fourth embodiment, similar to the third embodiment, the gate electrodes 22A and 22B are formed to be inclined to the [0$\bar{1}$1]- and [011]-directions, respectively, instead of the incident direction of the dopant ions. Therefore, the same advantages as those in the first embodiment is obtained.

Further, since the orientation notch 23 is formed in the running direction of the gate electrode 22A, which is inclined to the [0$\bar{1}$1]-direction, there is an additional advantage that the ion implantation into the substrate 21 can be finished using the popular, conventional ion implantation method without changing the pattern of the resist mask 26.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. An ion implantation method comprising steps of:
    (a) preparing a semiconductor substrate with a (100)-oriented crystal surface;
    (b) forming an elongated mask with a specific pattern on the surface of said substrate; and
    (c) irradiating a beam of dopant ions to the surface of said substrate along a first direction, thereby selectively implanting said dopant ions into said substrate using said mask;
    wherein said first direction has a first angle with a normal of the surface of said substrate in a plane perpendicular to a longitudinal axis of said mask, where said first angle is in the range from 7° C. to 60° C.;
    and wherein said first direction has a second angle with a lateral axis of said mask in a plane parallel to the surface of said substrate, where said second angle is in the range from 5° C. to 20° C.;
    and wherein said longitudinal axis of said mask is parallel to one of <011>directions or one of <0$\bar{1}$1>directions.

2. The method as claimed in claim 1 further comprising a step (d) performed after said step (c):
    wherein said step (d) is irradiating a beam of dopant ions to the surface of said substrate along a second direction, thereby selectively implanting said dopant ions into said substrate using said mask;
    and wherein said second direction has the same first angle as that of said step (c);
    and wherein said second direction has a third angle with the lateral axis of said mask in the plane parallel to the surface of said substrate, where said third angle is in the range from 5° C. to 20° C., and is on an opposite side to that of said first angle with respect to the lateral axis of said mask.

3. The method as claimed in claim 2, wherein in said step (d), said beam of dopant ions is irradiated to said substrate from the same side of said mask as that of said step (c).

4. The method as claimed in claim 3, wherein said third angle is equal to said first angle.

5. The method as claimed in claim 2, wherein said steps (c) and (d) are performed again to irradiate on an opposite side of said mask to that in said steps (c) and (d);
    whereby said dopant ions are implanted into said substrate on the both sides of said mask.

6. The method as claimed in claim 1, wherein said mask is a gate electrode of a MOSFET, and a pair of source/drain regions are formed in said substrate at each side of said gate electrode.

7. The method as claimed in claim 6, wherein a pair of sidewall spacers are additionally formed on each side of said gate electrode;
    and wherein said first angle is in the range from 50° C. to 60° C.

8. An ion implantation method comprising steps of:
    (a) preparing a semiconductor substrate with a (100)-oriented crystal surface;
    (b) forming an elongated mask with a specific pattern on the surface of said substrate;
    a longitudinal axis of said mask having a first angle with one of <011>-directions or one of <0$\bar{1}$1>-directions, where said first angle is in the range from 5° C. to 20° C.; and
    (c) irradiating a beam of dopant ions to the surface of said substrate along a first direction, thereby selectively implanting said dopant ions into said substrate using said mask;

wherein said first direction has a second angle with a normal of the surface of said substrate in a plane perpendicular to a longitudinal axis of said mask, where said second angle is in the range from 7° C. to 60° C.;

and wherein said first direction is approximately perpendicular to the longitudinal axis of said mask.

9. The method as claimed in claim 8, wherein said substrate has an orientation indicator that is in accordance with the longitudinal axis of said mask.

10. The method as claimed in claim 8, wherein said substrate has an orientation indicator that is not in accordance with the longitudinal axis of said mask.

11. The method as claimed in claim 8, further comprising the step of:

(d) irradiating a beam of dopant ions to the surface of said substrate along a second direction on an opposite side of said mask to said step (c), thereby selectively implanting said dopant ions into said substrate said the mask;

wherein said second direction has the same first angle as that of said step (c);

whereby said dopant ions are implanted into said substrate on the both sides of said mask.

12. The method as claimed in claim 8, wherein said mask is a gate electrode of a MOSFET, and a pair of source/drain regions are formed in said substrate at each side of said gate electrode.

13. The method as claimed in claim 8, wherein said gate electrode further comprising a pair of sidewall spacers;

and wherein said spacers are formed on each side of said gate electrode;

and wherein said first angle is in the range from 50° C. to 60° C.

* * * * *